(12) United States Patent
Baker et al.

(10) Patent No.: US 6,381,837 B1
(45) Date of Patent: May 7, 2002

(54) METHOD FOR MAKING AN ELECTRONIC CIRCUIT ASSEMBLY

(75) Inventors: Jay DeAvis Baker, W. Bloomfield; Edward McLeskey, Waterford; Delin Li, Canton; Cuong Van Pham, Belleville; Robert Edward Belke, West Bloomfield; Vivek Amir Jairazbhoy, Farmington Hills; Thomas B Krautheim, Belleville; Mohan R. Paruchuri, Canton; Lakhi Nandlal Goenka, Ann Arbor; Jun Ming Hu, Canton, all of MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/148,061

(22) Filed: Sep. 4, 1998

(51) Int. Cl.⁷ ................................................. H05K 3/34
(52) U.S. Cl. ............................ 29/840; 29/832; 29/834; 29/831; 29/846; 174/261
(58) Field of Search .......................... 29/840, 832, 831, 29/846, 847, 841, 836, 834, 833; 174/253, 261; 257/678

(56) References Cited

U.S. PATENT DOCUMENTS

| | | | |
|---|---|---|---|
| 3,801,388 A | | 4/1974 | Akiyama et al. |
| 3,953,924 A | * | 5/1976 | Zachry et al. ................ 29/625 |
| 4,404,059 A | | 9/1983 | Livshits et al. |
| 5,177,863 A | * | 1/1993 | Lam ............................ 29/830 |
| 5,453,581 A | * | 9/1995 | Liebman et al. ............ 174/261 |
| 5,489,750 A | * | 2/1996 | Sakimi et al. .............. 174/261 |
| 5,542,174 A | * | 8/1996 | Chiu ........................... 29/840 |
| 5,738,797 A | | 4/1998 | Belke, Jr. et al. |
| 5,932,993 A | * | 8/1999 | Kouwa et al. ................ 322/36 |
| 6,115,262 A | * | 9/2000 | Brunner et al. ............. 361/774 |
| 6,169,253 B1 | * | 1/2001 | Jairazbhoy et al. ......... 174/250 |

* cited by examiner

Primary Examiner—Carl J. Arbes
Assistant Examiner—Minh Trinh
(74) Attorney, Agent, or Firm—Steven L. Oberholtzer; Brinks Hofer Gilson & Lione

(57) ABSTRACT

A method for producing an electronic circuit assembly (e.g., a circuit board) from an etched tri-metal-layer structure which provides air bridge crossovers and specially designed bumps etched from a middle layer of the tri-metal-layer structure. The bumps are formed at particular circuit locations in order to provide interconnects for (1) heavy wirebonding, (2) fine wirebonding, or (3) direct chip attachment; or, to provide (4) lifters for assuring a minimum solder joint standoff height or (5) barriers for retarding solder joint crack propagation.

7 Claims, 11 Drawing Sheets

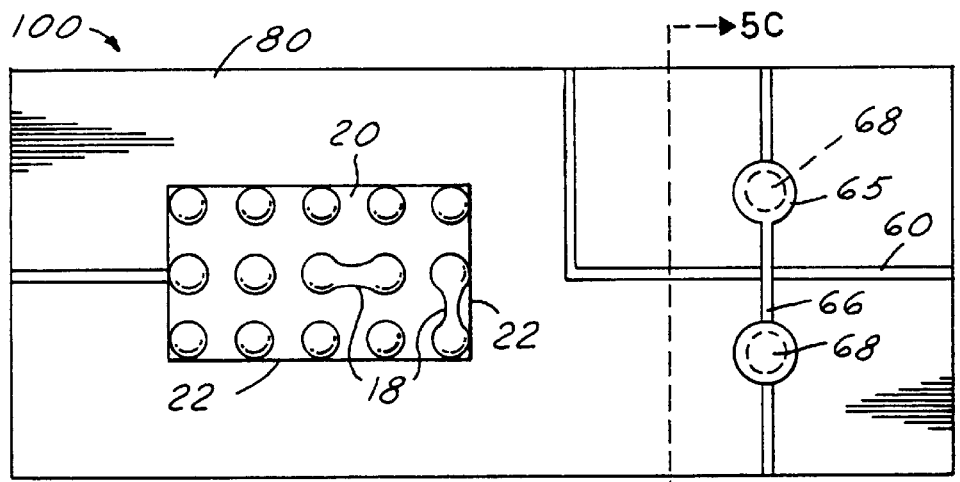
FIG. 5A (CONFIG. 1A)
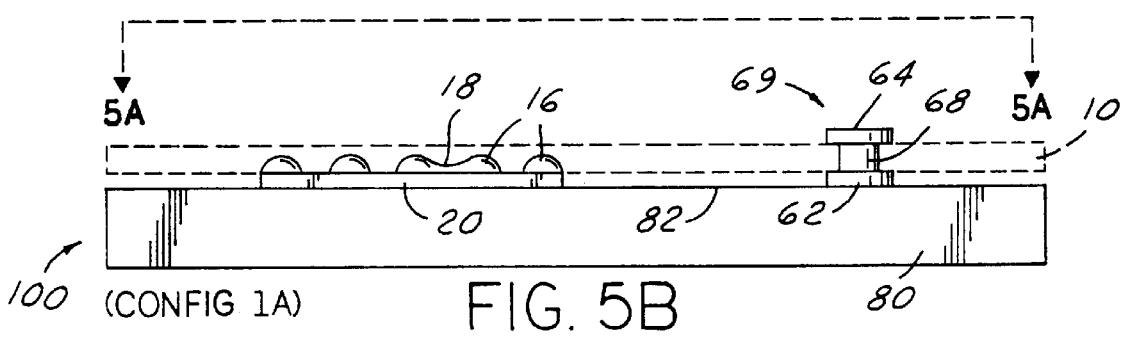
FIG. 5B (CONFIG. 1A)
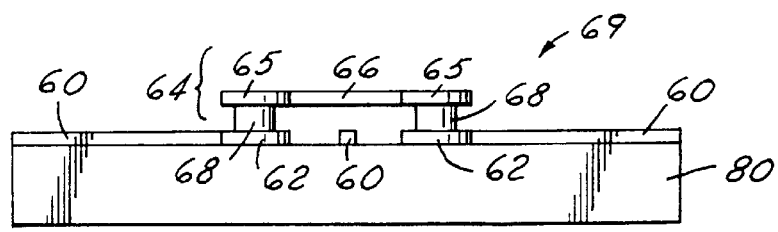
FIG. 5C (CONFIG 1A)
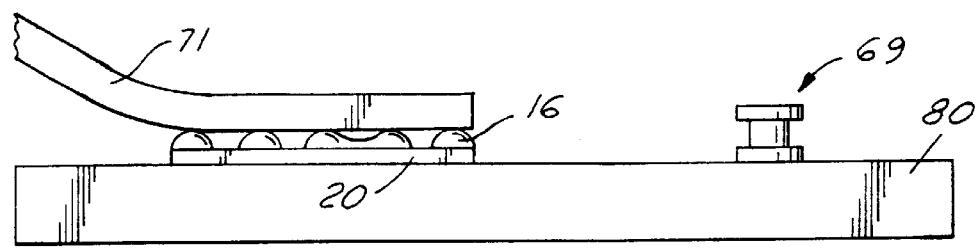
FIG. 6

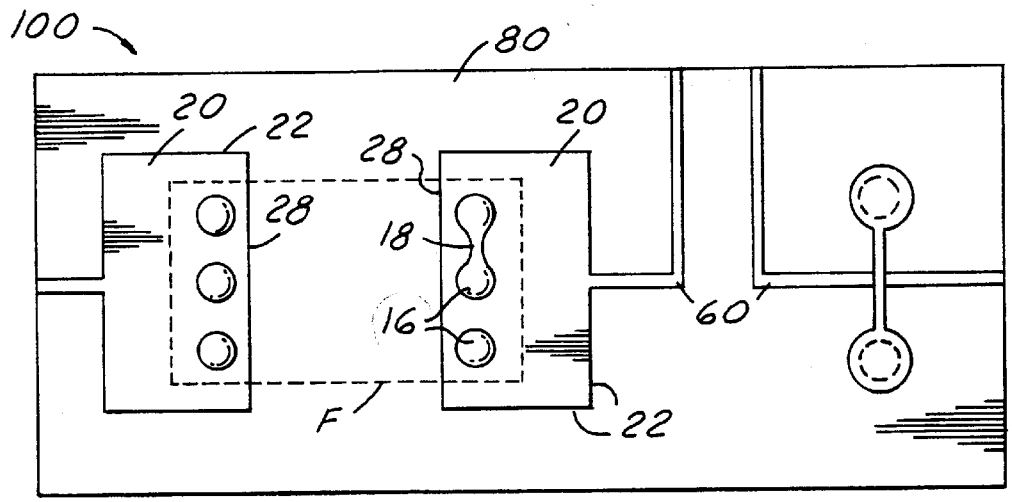
FIG. 7A (CONFIG. 1B)
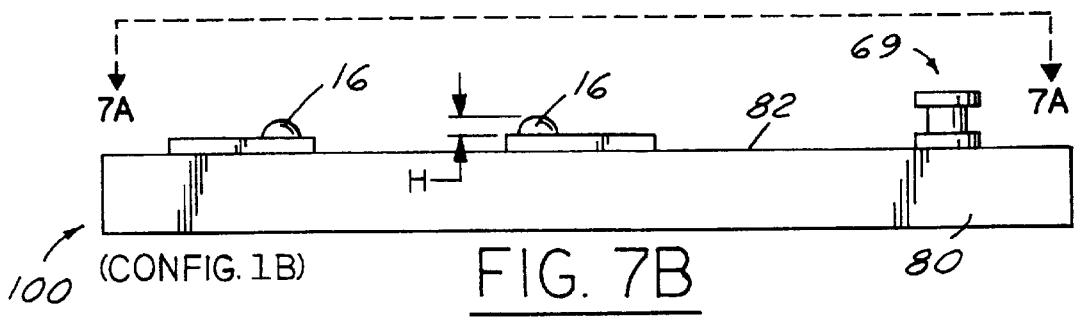
FIG. 7B (CONFIG. 1B)
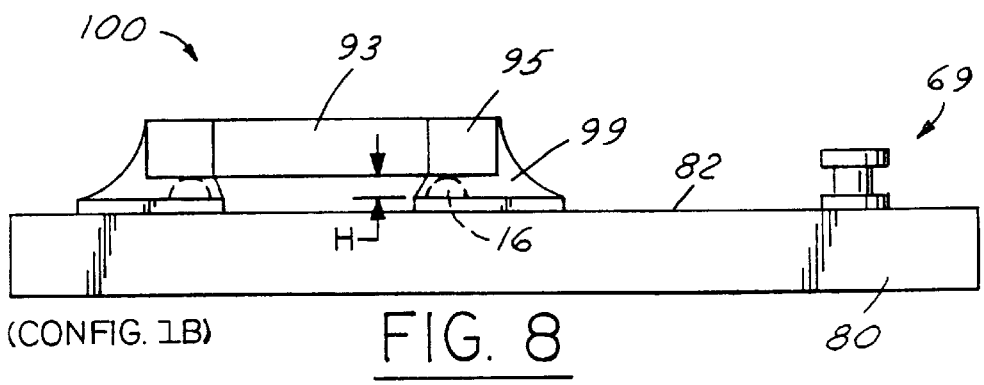
FIG. 8 (CONFIG. 1B)

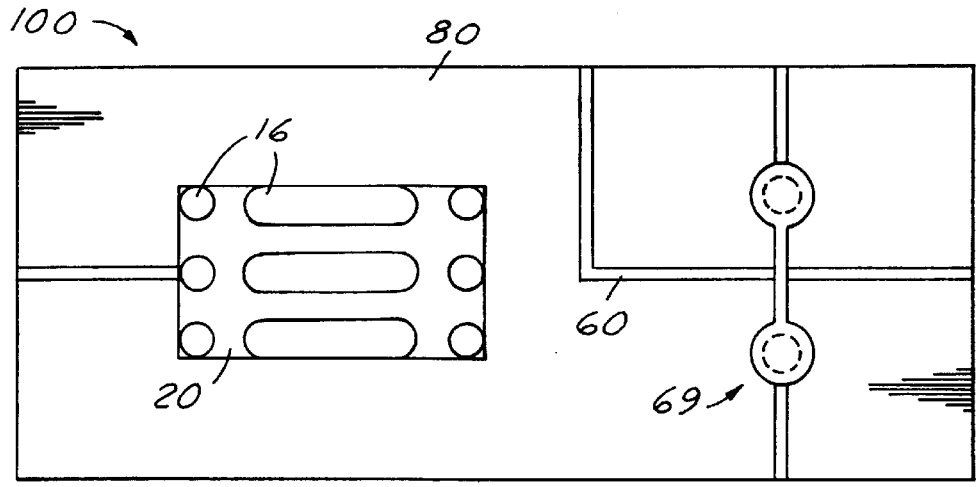
(CONFIG. 1A)    FIG. 9A
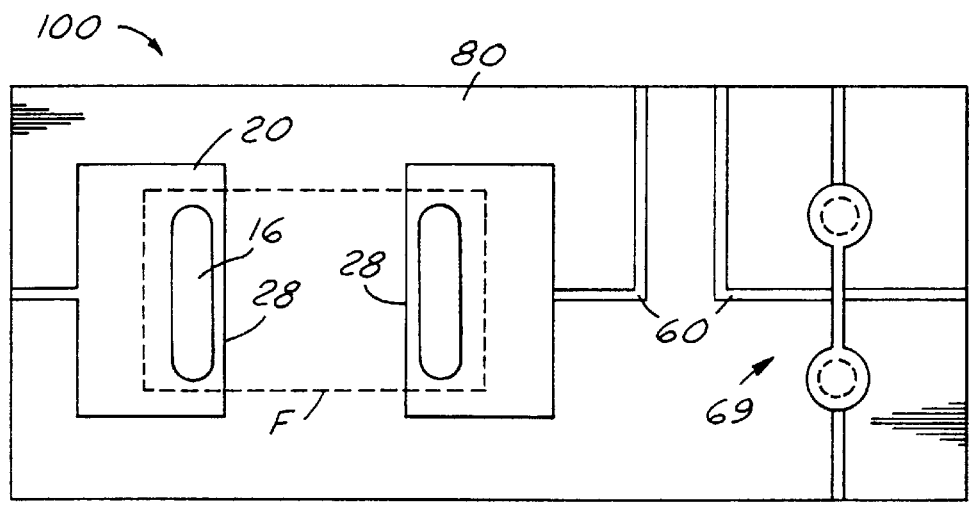
(CONFIG. 1B)    FIG. 9B
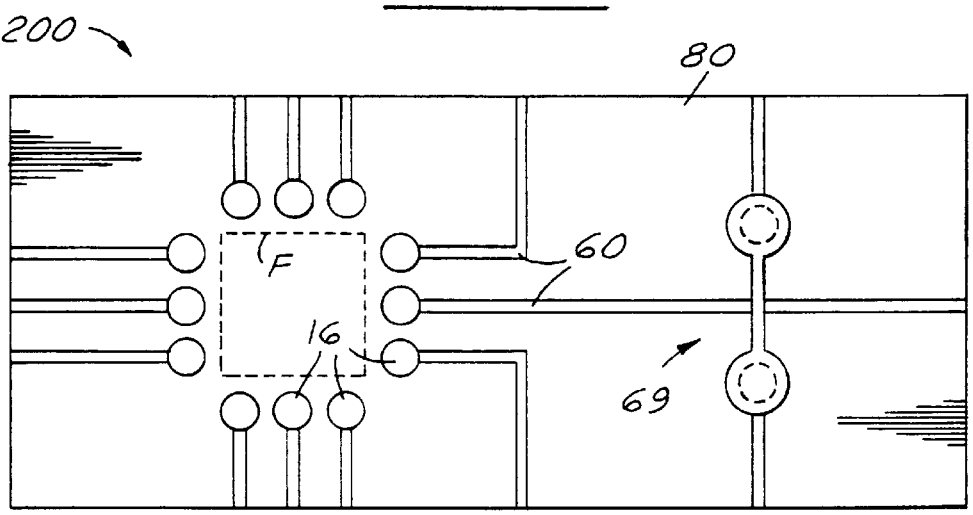
(CONFIG. 2A)    FIG. 10A

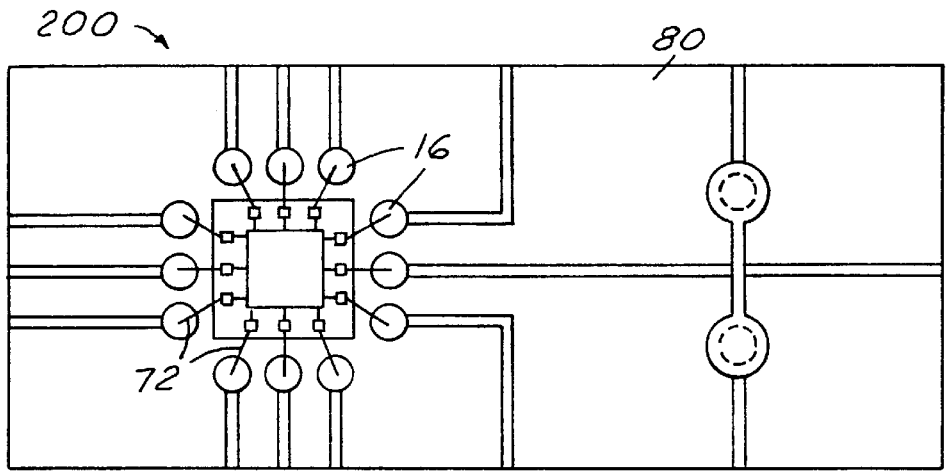
(CONFIG. 2A) FIG. 10B
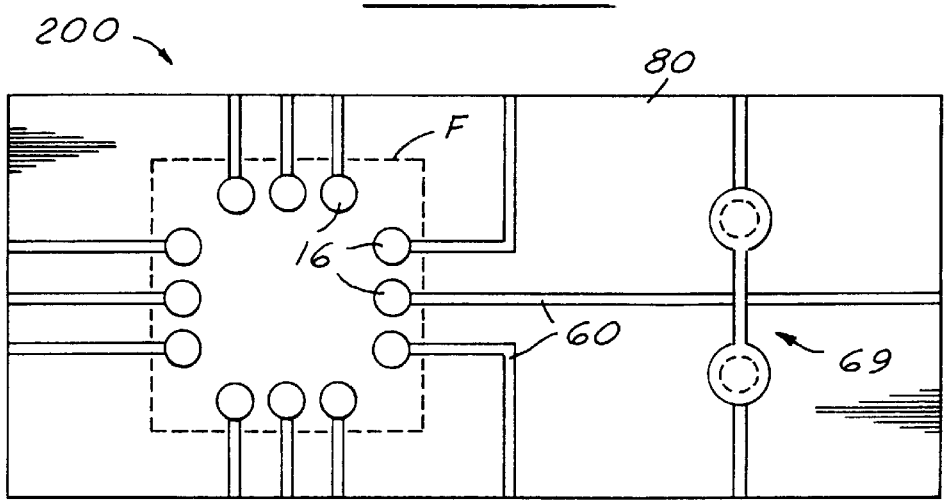
(CONFIG. 2B) FIG. 11A
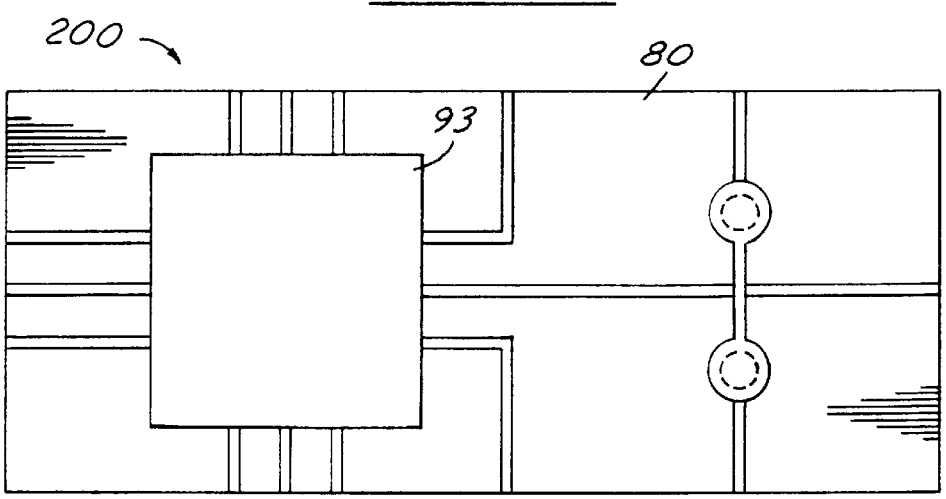
(CONFIG. 2B) FIG. 11B

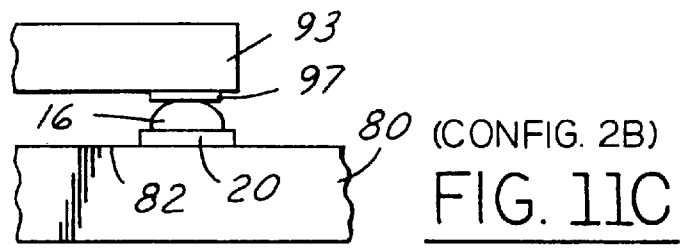
FIG. 11C (CONFIG. 2B)
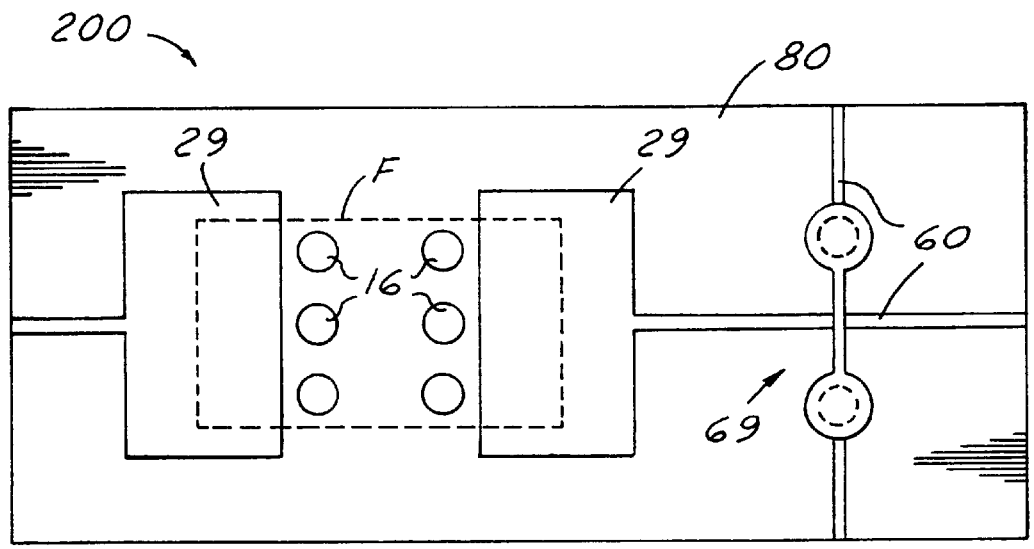
FIG. 12A (CONFIG. 2C)
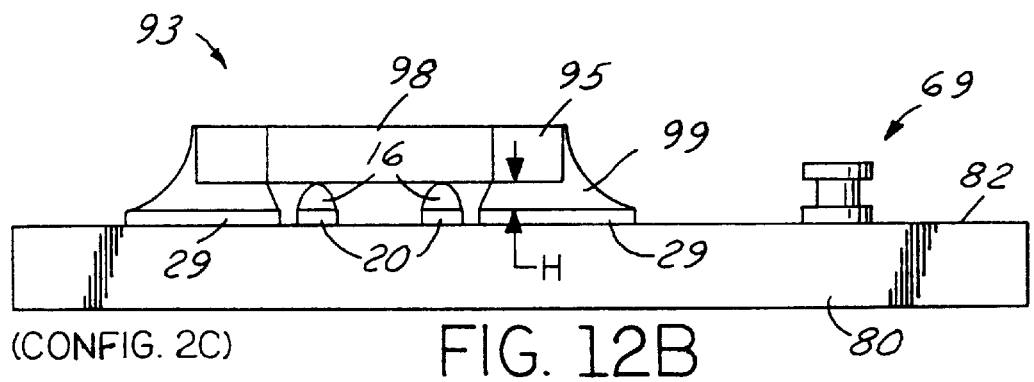
FIG. 12B (CONFIG. 2C)

METHOD FOR MAKING AN ELECTRONIC CIRCUIT ASSEMBLY

BACKGROUND OF THE INVENTION

1. Field of the Invention

The present invention relates generally to electronic circuit assemblies, and more particularly to a method for making an electronic circuit assembly out of etched trimetal-layered circuit structures.

2. Disclosure Information

U.S. Pat. Nos. 3,801,388 to Akiyama et al. (hereinafter "Akiyama"), U.S. Pat. No. 4,404,059 to Livshits et al. (hereinafter "Livshits"), and U.S. Pat. No. 5,738,79/7 to Belke, Jr. et al. (hereinafter "Belke"), all of which are incorporated herein by reference, disclose various methods for making electronic circuits which feature circuit crossovers or "air bridges" using a combination of plating and etching steps.

The air bridge structures disclosed in these patents are useful in offering design flexibility and printed circuit board real estate savings as far as routing and layout of circuit traces; however, they do not disclose or suggest any approach for accommodating certain circuit board interconnect processes, such as heavy wirebonding (e.g., using 5- to 20-mil aluminum wire, such as in wirebonding power transistor dice to leadframes or mounting pads), fine wirebonding (e.g., using less-than-5-mil gold wire, such as in connecting the I/O pads of bare integrated circuit dice to their respective circuit board mounting pads), or direct component attachment (e.g., bonding of flip-chips, BGAs (ball grid arrays), and the like directly to traces/pads on a circuit board substrate).

It would be desirable, therefore, to provide a method for using the aforementioned air bridge circuit structure with such interconnect processes as heavy and fine wirebonding and direct component attachment.

SUMMARY OF THE INVENTION

The present invention overcomes the deficiencies of prior art approaches by providing a method for making an electronic circuit assembly comprising the steps of: (a) providing a specially designed tri-metal-layer precircuit, (b) selectively etching the precircuit so as to urge the formation of a particular type of undercut in the tri-metal precircuit structure, and (c) continuing to etch the precircuit until a finished circuit is formed, wherein the circuit includes circuit traces, air bridge crossovers, and base pads having one or more etched bumps thereon. These bumps may then be used to facilitate heavy and fine wirebonding and direct chip attachment.

It is an object and advantage that the present invention provides the aforementioned air bridge crossover circuit structure while also providing bumps specially etched from the precircuit structure which may be advantageously utilized to accommodate heavy and fine wirebonding and direct chip attachment.

Another advantage is that the bumps provided by the present invention may be used to assure a minimum solder joint standoff height before, during, and after reflow soldering of a surface mount electronic component.

Yet another advantage is that the bumps of the present invention may be arranged so as to retard solder joint crack propagation in reflowed electronic components.

These and other advantages, features and objects of the invention will become apparent from the drawings, detailed description and claims which follow.

BRIEF DESCRIPTION OF THE DRAWINGS

FIGS. 5*a–c* are top, side, and side section views, respectively, of a circuit according to a first configuration of the first embodiment, particularly designed for heavy wirebonding.

FIG. 6 is a side view of the configuration shown in FIG. 5*b*, after heavy wirebonding.

FIGS. 7*a–b* are top and side views, respectively, of a circuit according to a second configuration of the first embodiment, particularly designed for arresting solder joint crack propagation.

FIG. 8 is a side view of the configuration shown in FIG. 7*b*, after component mounting and reflow soldering.

FIGS. 9*a–b* are top views of the first and second configurations of the first embodiment, respectively, having bumps shaped as elongated strips.

FIGS. 10*a–b* are top views of a first configuration of a second embodiment of the present invention before and after fine wirebonding, respectively.

FIGS. 11*a–b* are top views of a second configuration of a second embodiment of the present invention before and after direct chip attachment, respectively.

FIG. 11*c* is a side view of a portion of the configuration shown in FIG. 11*b*.

FIGS. 12*a–b* are top and side views of a third configuration of a second embodiment of the present invention before and after component reflow soldering, respectively.

DETAILED DESCRIPTION OF THE PREFERRED EMBODIMENTS

Figure 1A:
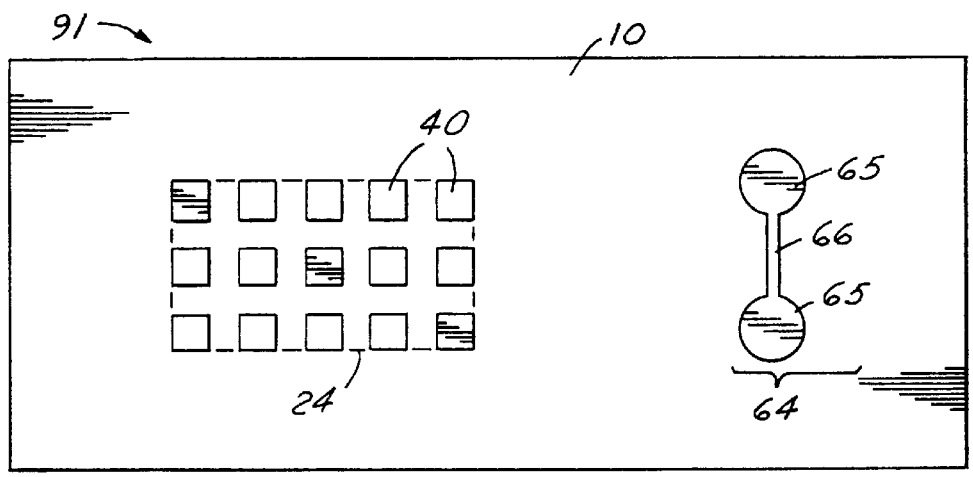
FIGS. 1*a–c* are top, side, and bottom views, respectively, of a precircuit according to a first embodiment of the present invention.

Referring now to the drawings, FIGS. 1–9 illustrate an electronic circuit assembly according to a first embodiment 100 of the present invention and the process steps for making the same. The assembly begins as a pre-circuit 91 as shown in FIGS. 1*a–c*, and is selectively etched so as to form the final structure 100 shown in FIGS. 5*a–c* and 7*a–c*.

Figure 1B:
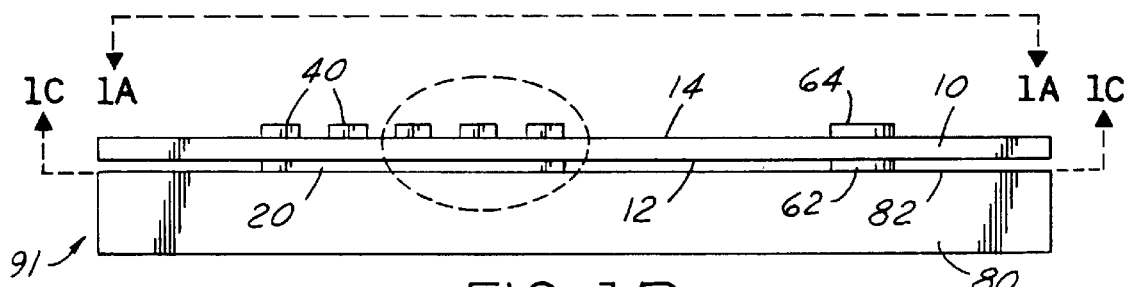
Figure 1C:
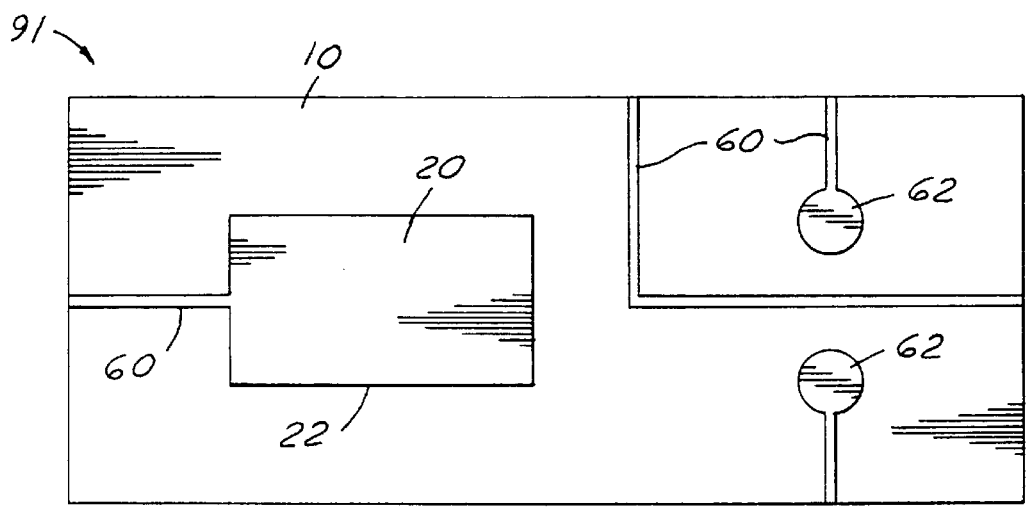

To assist the reader in understanding the present invention, all reference numbers used herein are summarized in the table below, along with the elements they represent:

10=Metallic sheet/first metal layer
12=Bottom surface of metallic sheet
14=Top surface of metallic sheet
16=Bumps formed from metallic sheet 18=Bridges of first metal between bumps
20=Base pad on bottom surface of metallic sheet
22=Perimeter of base pad
24=Perimeter of base pad projected onto top surface
26=Second (bottom) metal layer
28=Edge of base pad within component footprint
29=Mounting pad (for Config. 2C)
30=Undercuts in metallic sheet under masking pads
40=Masking pad on top surface of metallic sheet
46=Third (top) metal layer
52=Bottom etch resist pattern
53=Apertures or etch resist-free regions in 52/54
54=Top etch resist pattern
56=Masking material resistant to first metal etchant
57=Bottom pattern plating mask
58=Apertures or mask-free regions in 57/59
59=Top pattern plating mask
60=Circuit trace
62=Pedestal pad
64=Bridging element
65=Enlarged end of bridging element
66=Constricted portion of bridging element
68=Pedestal
69=Air bridge crossover
71=Heavy wirebonding wire
72=Fine wirebonding wire
80=Substrate
82=Electrically insulative surface of substrate
91=Precircuit for first embodiment
92=Precircuit for second embodiment
93=Surface mount electronic component
95=Termination of electronic component
97=I/O bond pad of chip component
98=Body portion of surface mount component
99=Solder joint
100=Final structure of first embodiment
200=Final structure of second embodiment
F=Footprint of electronic component
H=Solder joint standoff height
S=Spacing between adjacent masking pads
X=Direction tangential to metallic sheet
Z Direction orthogonal to metallic sheet
1A=Heavy wirebonding configuration
1B=Solder joint crack-arresting configuration
2A=Fine wirebonding configuration
2B=Direct chip attach configuration
2C=Lifter configuration The precircuit 91 for the first embodiment 100 generally comprises four basic layers of structure: (1) a metallic sheet 10 made of a first metal and having a bottom surface 12 and a top surface 14, (2) a first conductor pattern attached to the bottom surface 12 of the metallic sheet and made of a second metal, (3) a second conductor pattern attached to the top surface 14 of the metallic sheet and made of a third metal, and (4) a substrate 80 having an electrically insulative surface 82 to which the first conductor pattern is attached. The first conductor pattern in turn comprises: a base pad 20 having a first predetermined size and shape and a base pad perimeter 22 thereabout (which defines a respective projected base pad perimeter 24 on the top surface 14 of the metallic sheet), at least one circuit trace 60, and first and second pedestal pads 62 disposed proximate the circuit trace 60 on opposite sides thereof. The second conductor pattern comprises: a plurality of masking pads 40 arranged generally within the base pad perimeter 22 (or, more precisely, within the projected perimeter 24), wherein each masking pad 40 has a second predetermined size and shape smaller than the base pad 20; and a bridging element 64 having first and second enlarged ends 65 and a constricted portion 66 between the ends 65, wherein the bridging element 64 is oriented generally transverse to the circuit trace 60 with each enlarged end 65 disposed opposite a respective one of the pedestal pads 62, as illustrated in FIGS. 1a–c.

Figure 2A:
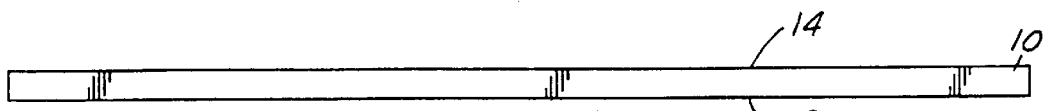
FIGS. 2*a–e* are side views of a precircuit undergoing additive process construction according to the prior art.
Figure 2B:
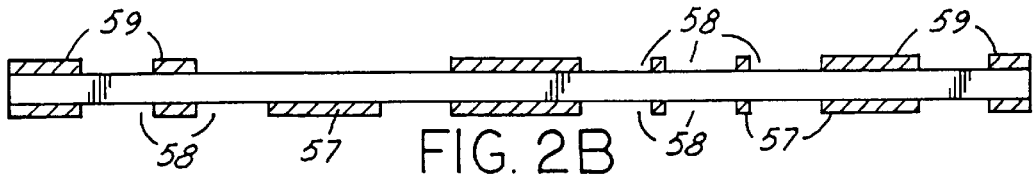
Figure 2C:
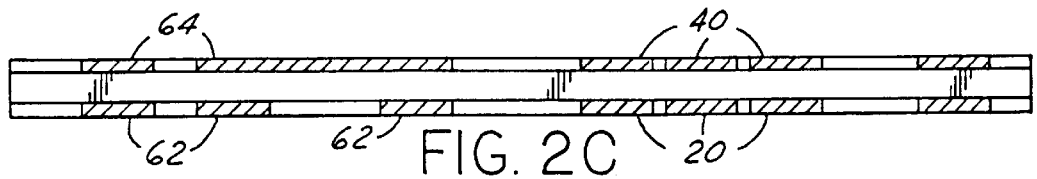
Figure 2D:
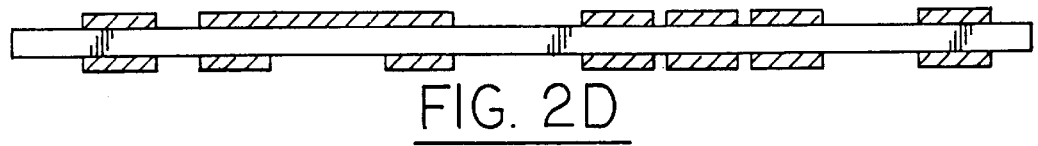
Figure 2E:

The precircuit 91 may be created using one of many different processes, such as the "additive" process of Belke or Livshits, or the "subtractive" process of Akiyama. An additive approach is illustrated in FIGS. 2a–e, involving the steps of: (1) providing a metallic sheet 10 made of the first metal having top and bottom surfaces 14/12 thereon (FIG. 2a); (2) applying a pattern plating mask 57/59 to each of the top and bottom surfaces 12/14, wherein each mask 57/59 has apertures or mask-free regions 58 therein which correspond to the respective first and second conductor patterns (FIG. 2b); (3) plating or depositing the second and third metals through the apertures/mask-free regions 58 in the respective masks 57/59 so as to form the first and second conductor patterns on the metallic sheet 10 (FIG. 2c); (4) stripping the masks 57/59 (FIG. 2d); and (5) attaching the first conductor pattern to the dielectric surface 82 of a suitable substrate 80 (FIG. 2e). These additive process steps are further described in Belke and Livshits.

Figure 3A:
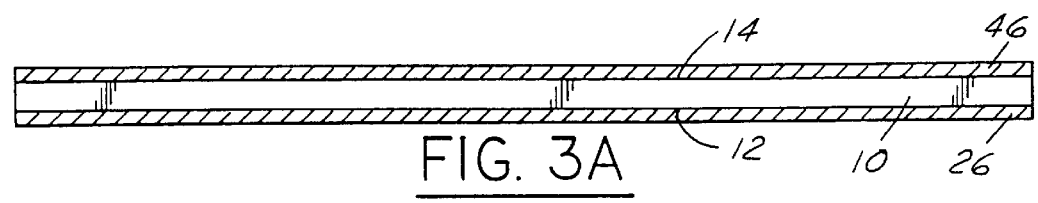
FIGS. 3*a–e* are side views of a precircuit undergoing subtractive process construction according to the prior art.
Figure 3B:
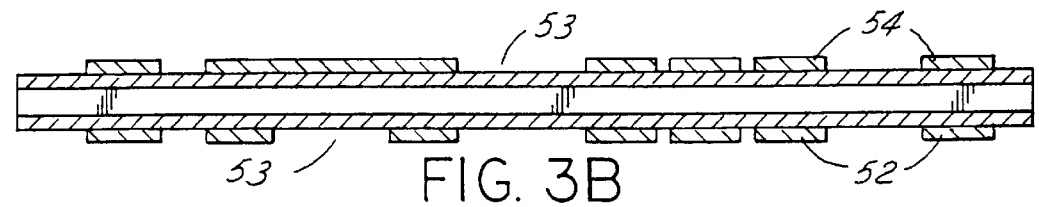
Figure 3C:
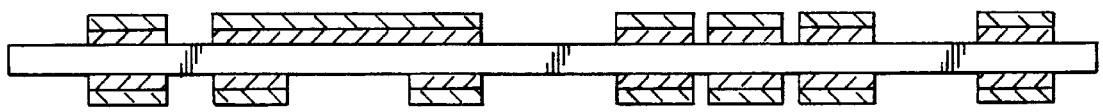
Figure 3D:
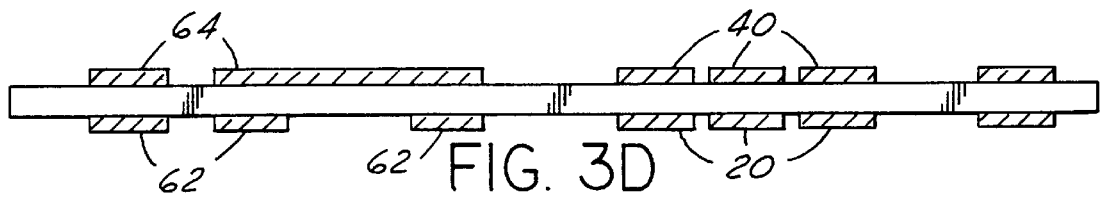
Figure 3E:
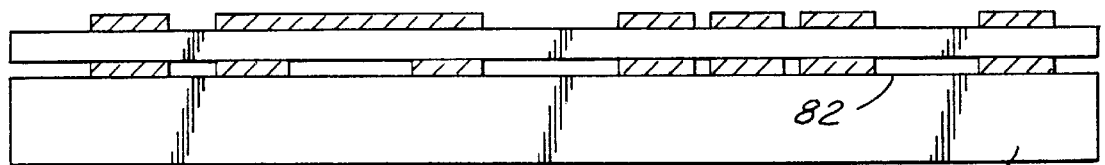

A subtractive approach for creating the precircuit 91 is illustrated in FIGS. 3a–e, involving the steps of: (1) providing a tri-metal laminate comprising a metallic sheet made of a first metal, a bottom metal layer 26 attached to the bottom surface 12 of the metallic sheet and made of a second metal, and a top metal layer 46 attached to the top surface 14 of the metallic sheet and made of a third metal (FIG. 3a); (2) applying a bottom etch resist pattern 52 (e.g., exposed photoresist) to the bottom metal layer with apertures or etch resist-free regions 53 therein conforming to the first conductor pattern to be formed thereon (FIG. 3b); (3) applying a top etch resist pattern 54 to the top metal layer also having apertures/etch resist-free regions 53 therein conforming to the second conductor pattern to be formed thereon (FIG. 3b); (4) etching the exposed portions (i.e., not covered by etch resist) of the bottom metal layer 26 in an etchant which etches substantially only the second metal so as to form the first conductor pattern (FIG. 3c); (5) etching the exposed portion of the top metal layer 46 in an etchant which etches substantially only the third metal so as to form the second conductive pattern (FIG. 3c); (6) stripping the top and bottom etch resist patterns 52/54 so as to expose the conductor patterns (FIG. 3d); and (7) attaching the first conductor pattern to the dielectric surface 82 of a suitable substrate 80 (FIG. 3e). Regardless of whether an additive or a subtractive approach is used to create the precircuit, the same precircuit structure 91 will result.

Figure 4:
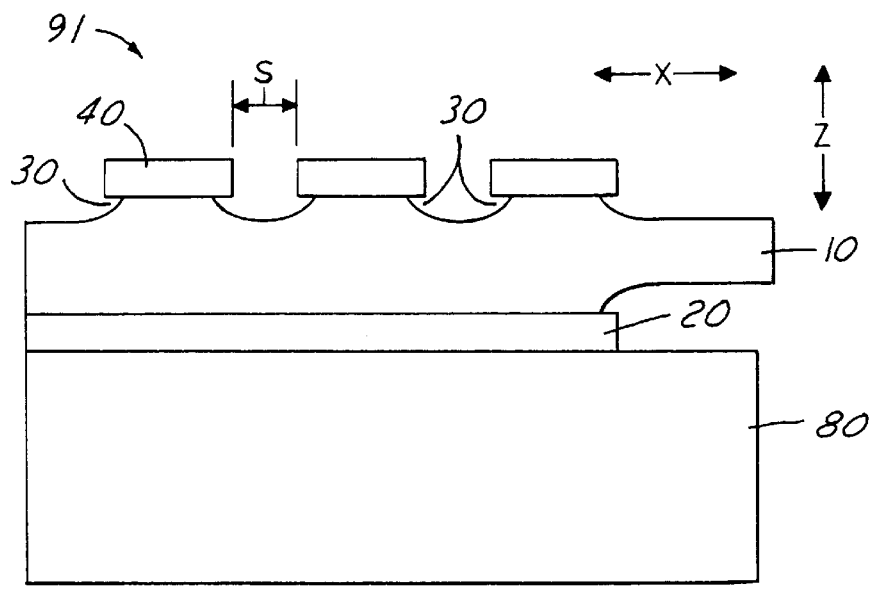
FIG. 4 is a magnified side view of a portion of the precircuit of FIG. 1 after initial etching, showing undercut masking pads.

Once the precircuit 91 is created, it is then exposed for a predetermined time to an etchant which etches substantially only the first metal, so as to form undercuts 30 in the first metal 10 directly underneath the masking pads 40, as shown in FIG. 4. The next step is to continue to etch the precircuit and undercut the masking pads to create a circuit 100, such that the metallic sheet 10 region underneath each masking pad 40 is substantially completely undercut, causing the pads 40 to become detached from the metallic sheet 10 and thereby providing a plurality of bumps 16 made of the first metal disposed atop the base pad 20 generally within the perimeter 22 thereof, as shown in FIGS. 5a–b. At the same time, the continued etching etches away those portions of the metallic sheet 10 that are exposed (i.e., not covered by the first and second conductor patterns); however, wherever the metallic sheet 10 is shielded from the etchant by portions of the first and second conductor patterns, the metallic sheet/ first metal in such regions remains unetched or only minimally etched (depending on the thickness, geometry, and relative positioning of the first and second pattern features thereat, the strength of and exposure time to the etchants, the relative thicknesses of the tri-metal layers 10/26/46, etc.). While the bumps 16 are being formed, a pedestal 68 made of the first metal sheet 10 is also being formed between each pedestal pad 62 and its respective enlarged end 65 of the bridging element 64, thereby providing an air bridge crossover 69 above the circuit trace 60, as shown in FIGS. 5a–c (particularly in FIG. 5c).

In order for the masking pads 40 to become undercut so as to become detached from the gradually forming first metal bumps 16, while at the same time causing the enlarged ends 65 of the bridging element 64 to become undercut but remaining attached to the gradually forming pedestals 68, the shape and size of each masking pad 40, bridging element feature (i.e., ends 65 and constricted portion 66), and base pad 20 must be carefully selected so that the circuit 100 ends up as described herein. Guidelines for selecting the relative sizes and shapes for these features may be found in Livshits, Akiyama, Belke, and below.

Two different configurations of bump layouts are shown in FIGS. 5a–b and 7a–b. In the first configuration (labeled "Config. 1A" in FIGS. 5a–b), the plurality of bumps 16 is distributed generally evenly across substantially all of the base pad 20. With the bumps 16 distributed thusly, an aluminum or other metal wirebonding wire 71 may be wirebonded to the plurality of bumps, as illustrated in FIG. 6, thus providing a way to effect heavy wirebonding interconnects.

In the second configuration (labeled "Config. 1B" in FIGS. 7a–b), the first conductor pattern includes at least two closely spaced base pads 20 (rather than only one), wherein these pads serve as mounting pads 20 to which a surface mount electronic component 93 (e.g., a resistor chip) may be soldered. Also, the second conductor pattern includes a plurality of bumps 16 for each of the at least two mounting pads 20. Here, each plurality of bumps 16 is arranged proximate an edge 28 of its respective mounting pad 20, within a projected footprint F the component 93. (As used herein, the "footprint" F of a component 93 refers to the region of the circuit which is covered by the component when the component is placed thereon.) With the bumps arranged in this way, the component 93 may be placed atop the two or more pads 20 such that a component termination 95 rests generally atop each plurality or cluster of bumps 16, as shown in FIG. 7b. Then, each termination 95 may be soldered to its respective mounting pad 20, such that each cluster of bumps 16 is generally enclosed within a solder joint 99 connecting each component termination 95 with its pad 20, as shown in FIG. 8. In this configuration, the bumps 16 provide two advantages: (1) they provide a minimum standoff height H, which typically improves solder joint resistance to thermal and physical stress, and (2) they provide a barrier in the otherwise normal solder joint crack propagation path, thereby helping to arrest or at least retard further crack propagation so as to prolong solder joint service life.

A wide variety of metals may be used in the present invention, such as copper, aluminum, nickel, steel, and so on. Typically, the second and third metals are the same metal, although they may optionally be different. The metals to be used for a given circuit structure are usually chosen according to the ability of the metals to be clad together or plated onto each other, and by their relative reaction rates with known etchants.

An exemplary configuration for the present embodiment 100 would provide a first metal sheet 10 (and hence bumps 16) made of 6-mil-thick aluminum, and the second and third metals (and hence first and second conductor patterns) made of 2-mil-thick copper. For this copper/aluminum/copper combination, the aluminum etchant may be, inter alia, NaOH or KOH, plus an oxidizing agent (e.g., NaNO3, NaNO2, or NaBrO3); the copper etchant may be, inter alia, chromic acid, nitric acid, or peroxysulfuric acid. The predetermined shape and size of the base pad 20 may conform with conventional shape and size guidelines used to design pads for heavy wirebonding or component reflow soldering, or they may vary therefrom, depending on the given design constraints; for example, the base pad 20 for either application may me a 60×80-mil rectangle. The predetermined size and shape of the masking pads 40 is more non-intuitive, since there is no analog to these pads under conventional wirebonding or reflowing practice. The shape of these pads 40 is preferably circular or square, but may be any other desired shape (e.g., elongated strips, as in FIGS. 9a–b). The size of each pad 40 is preferably 18 mils or less across in diameter or width, and most preferably 10 mils or less. This size is kept small to permit the etchant to form undercuts 30 in the first metal beneath the masking pads 40 in the "X" direction enough so that the connection between the pads 40 and the bumps 16 is weakened and the pad 40 is lifted away without etching too deeply in the "Z" direction, as shown in FIG. 4. The spacing S between adjacent pads 40 should be selected so as to allow enough space therebetween so the etchant may etch the first metal effectively. This spacing S is dependent on the type of etchant, the strength of the etchant, the process (e.g., dipping versus spraying), the etchant flow/spray rates, and so forth. A general rule of thumb is that the spacing S between adjacent pads 40 should be about one-half the pad diameter or width. For example, in FIGS. 5a–b, the masking pads 40 are generally square in shape, are 10 mils in width, and are spaced 5 mils apart on a 40×70-mil rectangular base pad 20, and eventually form first metal bumps 16 that are 3–6 mils high and 10 mils in diameter.

A second embodiment of the present invention is illustrated in FIGS. 10–12, comprising three different configurations (i.e., Configs. 2A, 2B and 2C). While the general size of the masking pads 40 is the same for both embodiments (100/200) and all of the configurations (1A–B and 2A–C), an important distinction between the first and second embodiments is that in the former case (Configs. 1A–B) there is preferably a plurality of masking pads 40 and bumps 16 atop each base pad 20, while in the latter case (Configs. 2A–C) there is only one masking pad 40 and bump 16 per base pad 20. Also, as illustrated in FIGS. 10–12, the base pads 20 of the second embodiment 2A–C are much smaller than those 20 of the first embodiment 1A–B, are generally about the same size as their corresponding masking pads 40, and are generally concentric with the pads 40. It may also be noted that while most of the bumps 16 of Configs. 1A–B are shown in FIGS. 5 and 7 as being discrete, it is permissible in the first embodiment that there be bridges 18 of the first metal connecting adjacent bumps 16; however, in Configs. 2A and 2B of the second embodiment, no bridges 18 of the first metal 10 are allowed to connect adjacent bumps 16, as will be explained in further detail below.

Because the basic structure for the second embodiment 200 is similar to that for the first embodiment 100, the same process steps for creating the first precircuit-91 may be used for creating the second precircuit 92, with the only difference being in where the apertures/mask-free regions 58 or etch resist patterns 52/54 are placed.

As illustrated in FIGS. 10*a–b,* the arrangement of bumps 16 in Config. 2A is best suited for fine wirebonding. Here, the bumps 16 are arranged generally about (i.e., outside) and proximate a projected footprint F of a surface mount electronic component 93, such as a bare die having I/O bond pads 97 thereon. With the bumps 16 arranged in this way, the component 93 may be attached to the circuit amid the bumps 16 (e.g., using an adhesive) with the component's I/O bond pads 97 arranged on the component's top surface. Then, each bond pad 97 may be fine-wirebonded to its respective bump 16 (e.g., using 3- to 5-mil diameter gold wire 72), as shown in FIG. 10*b*. An optional step of plating the bumps 16 may also be performed, such as by electrolytic, electroless, or immersion processing. For example, if the metallic sheet/bumps 10/16 are made of aluminum, a coating of immersion silver may be placed atop the bumps 16, and then a fine gold wire may be wirebonded to the silver bump coating.

Configuration 2B, shown in FIGS. 11*a–c,* is similar to 2A, but here the bumps 16 are arranged generally within the component footprint F, rather than about/outside the footprint. The bumps 16 are also arranged in matched relation with the plurality of respective I/O bond pads 97 on the face of the component 93. Here, the component 93 is preferably a bare die flip-chip, which may be oriented "face down" in conventional flip-chip fashion such that each I/O pad 97 rests atop a respective one of the bumps 16, whereupon the pads 97 are simultaneously bonded to the bumps 16, such as by thermocompression, ultrasonic bonding, or thermosonic bonding. If the metal layer 10 of the precircuit 92 is made of aluminum, as suggested above, then the I/O bond pads—which are typically also made of aluminum—may be easily bonded to the aluminum bumps 16, such as by conventional thermocompression bonding.

Config. 2C, illustrated in FIGS. 12*a–b,* is somewhat analogous to Config. 1B of the first embodiment, in that the bumps 16 in Config. 2C serve as "lifters" which hold the component 93 at a certain standoff height H above the mounting pads 29. However, while in Config. 1B the bumps 16 are formed atop each base pad 20 (with the base pad also serving as a mounting pad for the component), in Config. 2C two or more separate mounting pads 29 are provided with the bumps/base pads 16/20 being formed between/amid the mounting pads 29, but not atop these pads 29. Here, separate mounting pads 29 serve as mounting pads for the respective terminations 95 of the surface mount component 93. With the bumps 16 arranged as described, the component 93 may be oriented with its body portion 98 resting atop the bumps 16 and its terminations 95 registered atop their respective mounting pads 29, as shown in FIG. 12*b,* whereupon the terminations may be soldered to their respective pads (e.g., by reflow soldering, molten solder dispensing, etc.). In this arrangement, the bumps 16 serve to maintain the component 93 at a given standoff height H before, during, and after formation of the solder joints 99. For best results, the bumps 16 should be arranged in a pattern that supports the component 93 in a generally level orientation, as illustrated in FIG. 12*b*.

The process for creating the structures of Configs. 2A–C is similar to that for Configs. 1A–B, and begins by providing a precircuit 92 comprising: (1) a metallic sheet 10 made of a first metal and having a bottom surface 12 and a top surface 14; (2) a first conductor pattern attached to the bottom surface 12 of the first metal layer 10 and made of a second metal; (3) a second conductor pattern attached to the top surface 14 of the first metal layer 10 and made of a third metal; and (4) a substrate 80 having an electrically insulative surface 82 to which the first conductor pattern is attached.

The first conductor pattern comprises: a plurality of base pads 20 each having a first predetermined size and shape and a base pad perimeter 22 thereabout; a circuit trace 60; and first and second pedestal pads 62 disposed proximate the circuit trace 60 on opposite sides thereof. The second conductor pattern comprises: a masking pad 40 generally centered opposite each base pad 20, each masking pad 40 having a second predetermined size and shape generally congruent in size with the first predetermined size and shape of its respective base pad 20; and a bridging element 64 having first and second enlarged ends 65 and a constricted portion 66 therebetween, wherein the element 64 is oriented generally transverse to the circuit trace with each enlarged end disposed opposite a respective one of the pedestal pads 62. The specific placement of the masking pads 40 and base pads 20 (and hence the placement of the first metal bumps 16 formed therebetween) is determined according to which of the three configurations is desired; these placement schemes are described above and illustrated in the drawings. After providing the precircuit 92, it is then etched in a manner similar to the method for forming the first embodiment 100, so as to undercut and remove the masking pads 40 and form a bump 16 made of the first metal disposed atop each base/mounting pad 20, as well as forming the air bridge crossover(s) 69.

It should be noted that the bumps 16 for Configs. 2A–B should be discrete; that is, no bridges 18 of the first metal may connect any such bump 16 with another. This is because in these configurations, each bump 16 is eventually connected with a single chip I/O bond pad 97, so electrical isolation is required among each bump 16 and any adjacent bumps 16. However, in Config. 2C it is permissible for bridges 18 of the first metal to connect any bumps together, since these bumps do not connect with any electrical termination or bond pad of the component 93, but are merely physical lifters.

Figure 13:
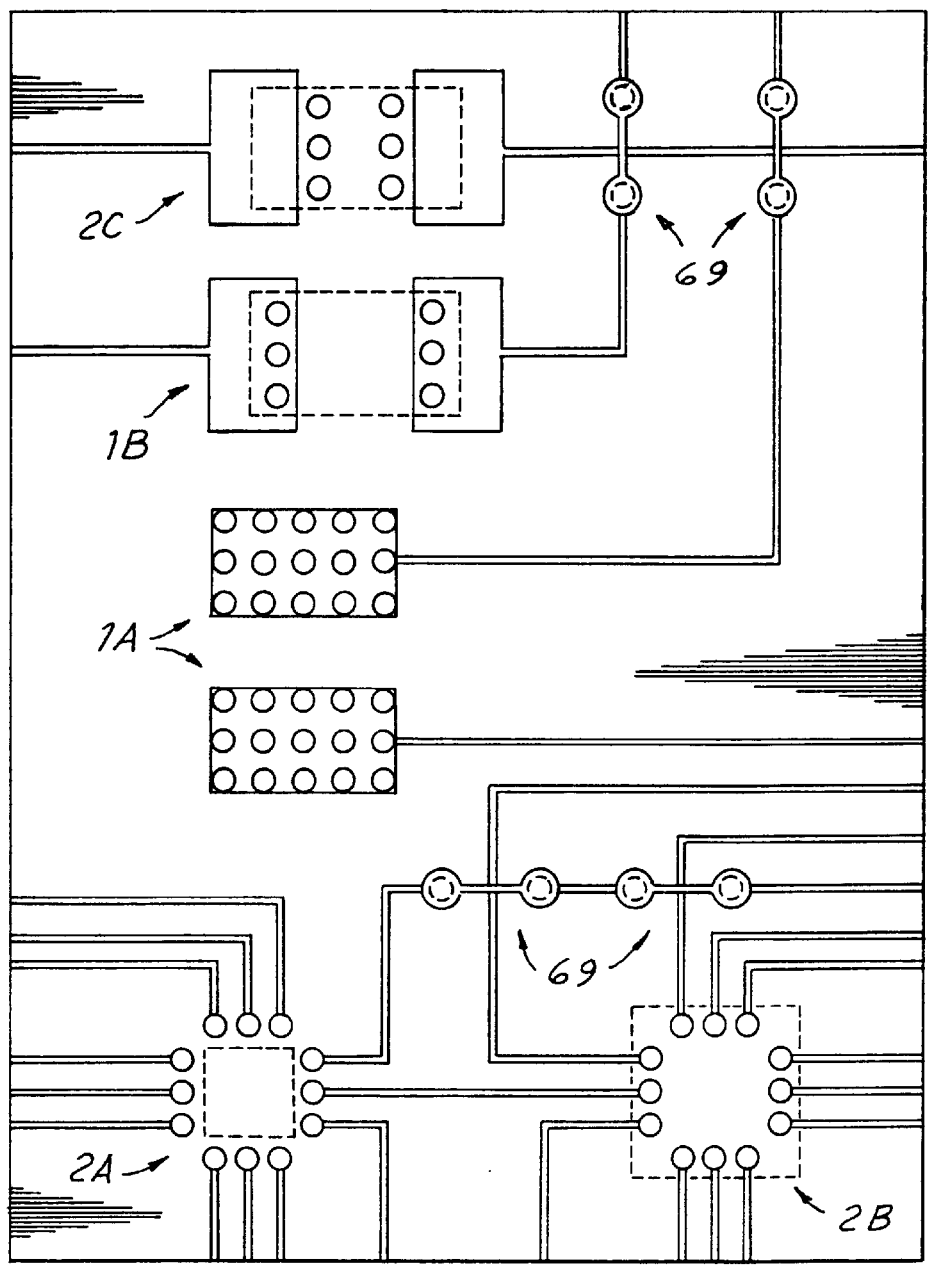
FIG. 13 is a top view of various configurations of the first and second embodiments of the present invention before component or bondwire attachment.
Figure 14A:
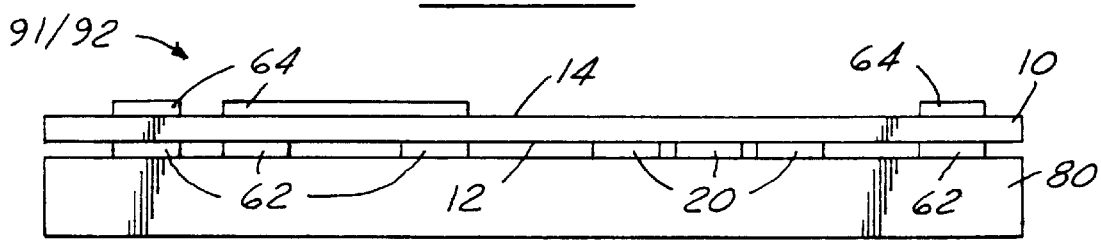
FIGS. 14*a–d* are side views of a precircuit undergoing a first alternative method for forming bumps according to the present invention.
Figure 14B:
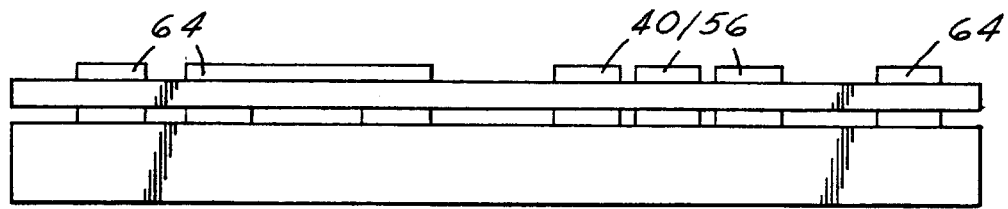
Figure 14C:
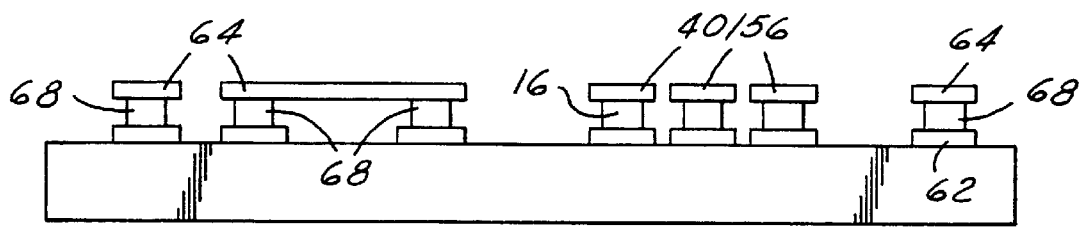
Figure 14D:
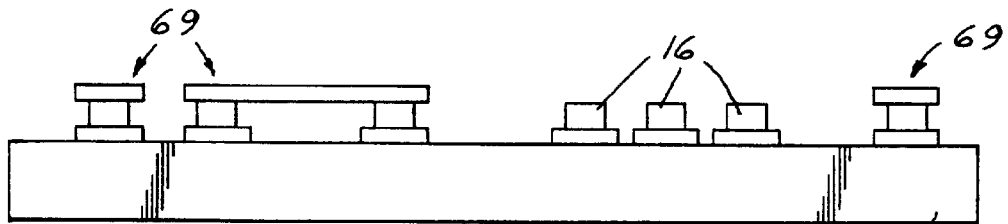

In order to provide a comparison among all the configurations of the two embodiments and to present an example of their respective scales, FIG. 13 shows the various configurations for both embodiments 100/200 in one drawing.

Two alternative methods for forming the bumps 16 in either of the two embodiments 100/200 are illustrated in FIGS. 14–15. The first alternative method is shown in FIGS. 14*a–d,* which begins by providing either of the two precircuits 91/92 as described above, except that the masking pad(s) 40 is/are made of a masking material 56 that is different from the first, second and third metals, is resistant to the first metal etchant, and can be etched in an etchant (or removed by some means) that does not significantly attack/etch the first, second, and third metals. This material 56 may be a metal, a polymer, etc., and should be selected in light of the first, second, and third metals chosen and their respective etchants. For example, the masking material 56 may be an organic photoimageable etch resist that is not significantly attacked/etched by the first metal etchant, and which can be stripped using a solvent that does not appreciably attack the first, second, and third metals. As another example, the masking material 56 may be an etch-resistant adhesive film that may be subsequently peeled away from metal sheet 10. The masking material pads 40/56 are attached to the top surface 14 of the first metal sheet 10 as a step separate from the attachment/formation of the bridging elements, preferably thereafter, as illustrated in FIG. 14*b*. After the modified precircuit is provided, the precircuit is exposed to an etchant which etches substantially only the first metal layer 10, thereby etching away substantially all of the first metal layer 10 except: (1) a bump 16 made of the first metal 10 underneath each masking material pad 40/56, and (2) a pedestal 68 made of the first metal 10 between each pedestal pad and its respective enlarged end of the bridging element, thus providing an air bridge crossover above the circuit trace 60, as illustrated in FIG. 14c. The masking material 56 may then be stripped away, thus exposing the first metal bumps 16, as shown in FIG. 14d. Note that in this alternative approach, it is not necessary that the masking pads 40 be sized such that they become undercut and detached from the first metal bumps 16, because they are instead stripped away as a separate process step after formation of the circuit's bumps and air bridge(s).

Figure 15A:
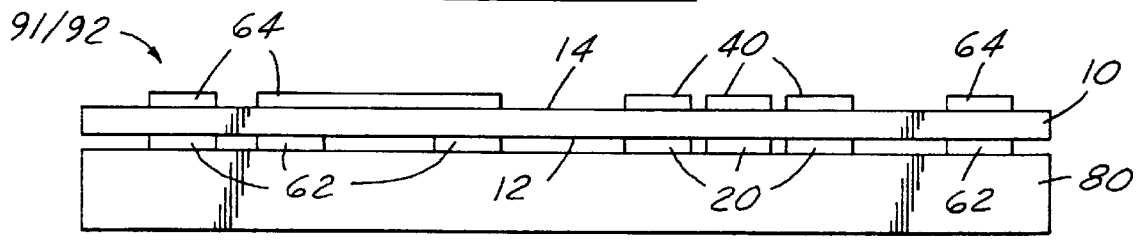
FIGS. 15*a–d* are side views of a precircuit undergoing second alternative method for forming bumps according to the present invention.
Figure 15B:
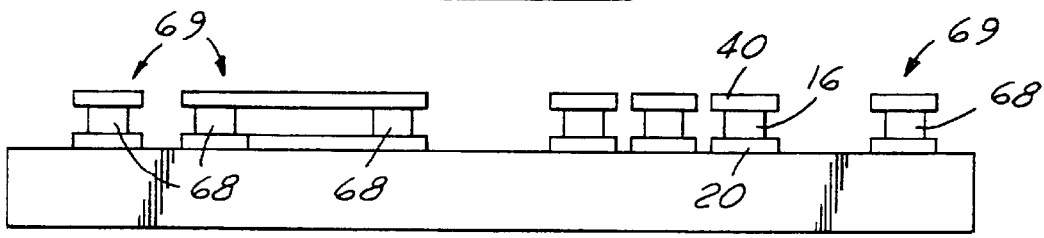
Figure 15C:
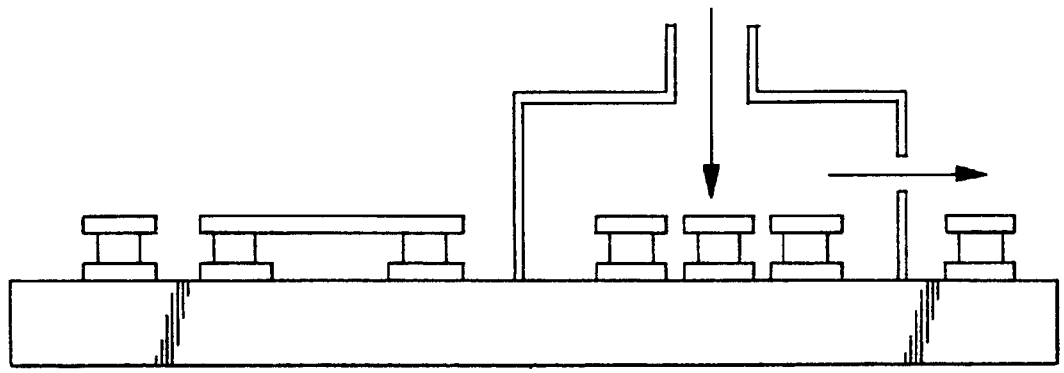
Figure 15D:
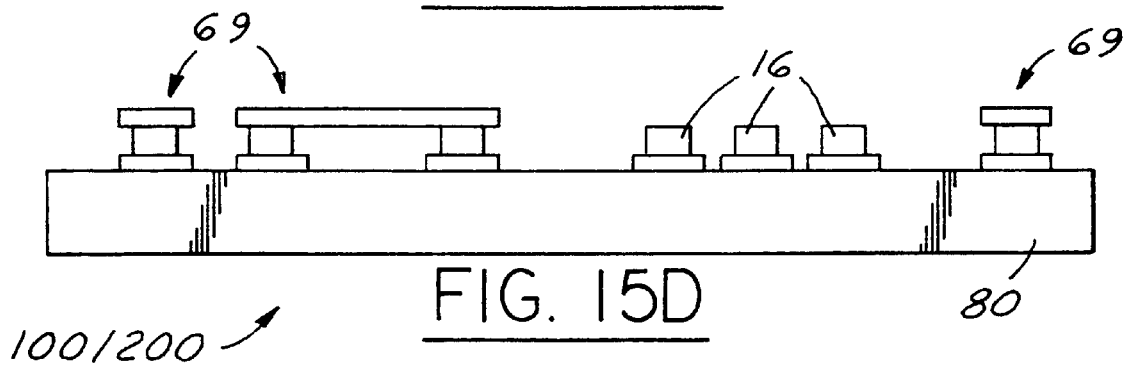

The second alternative method is shown in FIGS. 15a–d. Here, the same precircuit 91/92 as in Configs. 1A–B and 2A–C is provided—i.e., the masking pads 40 are made of the third metal, as are the other second conductor pattern elements—however, the masking pads 40 do not have to be sized so as to become drastically undercut and thus detached from the first metal bumps 16. Like the first alternative approach, after the modified precircuit is provided, the precircuit is exposed to an etchant which etches substantially only the first metal layer 10, thereby etching away substantially all of the first metal layer 10 except: (1) a bump 16 made of the first metal 10 underneath each masking pad 40, and (2) a pedestal 68 made of the first metal 10 between each pedestal pad and its respective enlarged end of the bridging element, thus providing an air bridge crossover above the circuit trace 60, as illustrated in FIG. 15b. Then, only the masking pads 40 are selectively etched, in an etchant which etches substantially only the third metal, thereby exposing the bumps 16 underneath, as shown in FIGS. 15c–d. This latter step may be accomplished by masking the rest of the second conductor pattern with an etch resist that is resistant to the third metal etchant, or (as illustrated in FIG. 15c) by sealing off the masking pads 40 from the rest of the second conductor pattern and exposing only the sealed off pads 40 to a third metal etchant.

Various other modifications to the present invention may occur to those skilled in the art to which the present invention pertains. For example, although circuit traces 60 are not shown in some drawings (for clarity), one skilled in the art will appreciate that a circuit trace or conductive via would typically be connected to each base pad 20, mounting pad 20/29, pedestal pad 62, and bump 16 in Configs. 2A–B for connection with other pads/traces/components in the electronic circuit assembly or printed circuit board. Also, although reference is made herein to "soldering" an electronic component to the circuit, equivalent processes such as conductive adhesive bonding (e.g., applying and curing a heat-activated silver-filled epoxy) may instead be used. Additionally, "soldering" may include reflow soldering, molten solder dispensing, or any other process used to connect component terminations to their associated mounting pads. Moreover, the "I/O bond pads" include not only the typical aluminum bond pads found on bare dice in flip-chip applications, but may also include balls or bumps made of gold, solder, and the like which serve as device I/O interconnects; the bond pads/balls/bumps may be arranged about the outer periphery of the device, or may be distributed generally evenly across a face of the device (e.g., BGAs). Additionally, it will be appreciated that the substrate 80 to which the first conductor pattern is attached may be made of metal, polymer, ceramic, or other materials, so long as the surface 82 thereof to which the conductor pattern is connected is electrically insulative. For example, the substrate 80 may comprise an aluminum plate with a coating of electrically insulative epoxy, adhesive, curable film, or the like. The surface 82 may be an adhesive in itself, which effects the bonding of the first conductor pattern to the substrate 80, or a separate adhesive may be interposed between the substrate surface 82 and the conductor pattern. Also, two or more of the configurations disclosed herein may be combined as desired, such as in combining Configs. 1B and 2C, which would provide bumps 16 both on the mounting pads 20 and between the mounting pads 20. Other modifications not explicitly mentioned herein are also possible and within the scope of the present invention. It is the following claims, including all equivalents, which define the scope of the present invention.

What is claimed is:

1. A method for making an electronic circuit assembly, comprising the steps of:
   (a) providing a precircuit comprising:
      (i) a metallic sheet made of a first metal and having a top surface and a bottom surface;
      (ii) a first conductor pattern attached to the bottom surface of the metallic sheet and made of a second metal, wherein the first conductor pattern comprises:
         (A) a base pad having a first predetermined size and shape and a base pad perimeter thereabout,
         (B) a circuit trace, and
         (C) first and second pedestal pads disposed proximate the circuit trace on opposite sides thereof;
      (iii) a second conductor pattern attached to the top surface of the metallic sheet and made of a third metal, wherein the second conductor pattern comprises:
         (A) a plurality of masking pads arranged generally within the base pad perimeter, wherein each masking pad has a second predetermined size and shape smaller than the base pad, and
         (B) a bridging element having first and second enlarged ends and a constricted portion therebetween, the bridging element being oriented generally transverse to the circuit trace with each enlarged end disposed opposite a respective one of the pedestal pads; and
      (iv) a substrate having an electrically insulative surface to which the first conductor pattern is attached;
   (b) etching the precircuit in an etchant which etches substantially only the first metal, so as to form undercuts in the metallic sheet directly beneath the masking pads; and
   (c) continuing to etch the precircuit and undercut the masking pads to create a circuit,
      (i) such that the metallic sheet beneath each masking pad is substantially completely undercut causing the masking pads to detach from the metallic sheet, thereby providing a plurality of bumps made of the first metal disposed atop the base pad within the base pad perimeter to form a bonding pad,
      (ii) wherein a pedestal made of the first metal is formed between each pedestal pad and its respective enlarged end of the bridging element, thereby providing an air bridge crossover above the circuit trace.

2. A method according to claim 1, wherein the second and third metals are the same metal.

3. A method according to claim 1, wherein the first metal is aluminum and the second and third metals are copper.

4. A method according to claim 1, wherein the plurality of bumps is distributed generally evenly across substantially all of the base pad.

5. A method according to claim 4, further comprising the step of:

(d1) wirebonding an end of a wirebond wire to the plurality of bumps atop the base pad.

6. A method according to claim 1, wherein the first conductor pattern includes at least two base pads to which a surface mount electronic component may be soldered and wherein the second conductor pattern includes a plurality of masking pads for each of the at least two base pads, wherein each plurality of bumps for the at least two base pads is arranged proximate an edge of its respective base pad within a projected footprint of the surface mount electronic component.

7. A method according to claim 6, further comprising the steps of:
(d2) placing the surface mount electronic component atop the at least two base pads such that a termination of the component rests generally atop each plurality of bumps atop its respective base pad; and
(e) soldering each component termination to its respective base pad, such that each plurality of bumps is generally enclosed within a solder joint connecting each component termination with its respective base pad.

* * * * *